(12) United States Patent
Kurtz et al.

(10) Patent No.: US 7,057,247 B2
(45) Date of Patent: Jun. 6, 2006

(54) COMBINED ABSOLUTE DIFFERENTIAL TRANSDUCER

(75) Inventors: Anthony D. Kurtz, Ridgewood, NJ (US); Alexander A. Ned, Wayne, NJ (US)

(73) Assignee: Kulite Semiconductor Products, Inc.

( * ) Notice: Subject to any disclaimer, the term of this patent is extended or adjusted under 35 U.S.C. 154(b) by 573 days.

(21) Appl. No.: 10/016,035

(22) Filed: Dec. 12, 2001

(65) Prior Publication Data

US 2003/0107096 A1  Jun. 12, 2003

(51) Int. Cl.
*H01L 29/82* (2006.01)
*H01L 23/10* (2006.01)

(52) U.S. Cl. ............... 257/419; 257/418; 257/417; 257/710

(58) Field of Classification Search ......... 257/417–419, 257/415, 684, 710; 438/53, 50–51, 456
See application file for complete search history.

(56) References Cited

U.S. PATENT DOCUMENTS

| | | | | |
|---|---|---|---|---|
| 4,025,942 A | * | 5/1977 | Kurtz ..................... | 257/417 |
| 4,222,277 A | * | 9/1980 | Kurtz et al. ............. | 73/721 |
| 4,236,137 A | | 11/1980 | Kurtz et al. ............. | 338/4 |
| 4,790,192 A | * | 12/1988 | Knecht et al. ........... | 73/721 |
| 5,286,671 A | | 2/1994 | Kurtz et al. ............. | 437/64 |
| 5,955,771 A | | 9/1999 | Kurtz et al. ............. | 257/419 |

* cited by examiner

*Primary Examiner*—Shouxiang Hu
(74) *Attorney, Agent, or Firm*—Plevy & Howard, PC

(57) ABSTRACT

There is disclosed a combined absolute differential pressure transducer which consists of two sensors made from the same wafer silicon and selected to be adjacent to each other on the wafer. Since the same pressure is applied to the boss side of both sensors and a second pressure is applied to the opposite side of the differential sensor, deflection and the stress of the second sensor is determined by the pressure difference across the deflecting portion of the sensor. To obtain the same stresses in the thin section of each sensor, the overall active area of each sensor is different. For the same thickness read, the absolute value of $P_2-P_1$ where $P_2$ is the pressure applied to the front side of the two sensors and $P_1$ is the pressure applied to the differential sensor through the metal tube is less than $P_2$ to obtain the same stress in each sensor a great active area in the differential sensor is required. Conversely, if the absolute value of $P_2-P_1$ is greater than $P_2$, then a smaller active area in the differential sensor is required. By choosing adjacent sensors with the same web thickness, but different size active areas the thermal co-efficient and the thermal sensitivity are controlled by the impurity concentrations of the P regions and by how well they match each other. Thus, the thermal properties of the two individual sensors are closely controlled and matched to each other resulting in an improved overall combined absolute differential transducer.

19 Claims, 14 Drawing Sheets

COMBINED ABSOLUTE DIFFERENTIAL TRANSDUCER

FIELD OF INVENTION

This invention relates to a combined true differential and absolute pressure transducer mounted in a single header.

BACKGROUND OF INVENTION

The present pressure transducer consists of two leadless piezoresistive sensors (separately) mounted on the header pins in accordance with the methods disclosed in Kulite U.S. Pat. No. 5,955,771 ('771) entitled, "Sensors for use in High Vibrational Applications and Methods for Fabricating the Same" which issued on Sep. 21, 1999 to A. D. Kurtz et al., the inventor herein and assigned to Kulite Semiconductor Products, Inc., the assignee herein. The entire ('771) patent is incorporated herein by reference. The individual sensors themselves are also produced in accordance with the methods outlined in the aforementioned patent with certain exceptions.

In the above patent, the individual sensor had four apertures in the glass structure affixed to the silicon member through which metal-glass frit was inserted to make connection to the metalized contact areas on the silicon member, and subsequently secured to the pins of the header. The first or absolute sensor is made in the described manner (FIG. 1A). FIG. 1A is presented herein as prior art and is FIG. 1 of the U.S. Pat. No. 5,955,771. As can be ascertained, FIG. 1A is a perspective view of a sensor transducer chip 12A as shown in the '771 patent. The chip 12A comprises an individual pressure sensor 44 which is hermetically sealed by a cover 72A.

SUMMARY OF THE INVENTION

In the present invention the second or differential sensor, there is provided a fifth aperture (FIG. 1B), 19B which provides access to the deflecting portion of the silicon member. The header itself has a conforming aperture in the center of its pin circle into which a metal tube is affixed by glassing at the same time the pins are glassed into the header (FIGS. 8A, 8B, 8C). The second sensor is mounted to its set of pins in the manner previously described with the central aperture in the glass portion of the sensor aligned with the metal tube located in the center of the second pin circle. A single or first pressure or force may be applied to the top surface of the header and a separate pressure or force may be applied to the metal tube on the backside of the header (FIG. 9). Thus, one of the sensors, the one without the fifth aperture in its glass structure, will respond to an absolute pressure, while the second sensor will respond to the difference in pressure between the pressure on the front and the pressure on the rear of the header.

In the preferred embodiment, the two sensors are made from the same wafer of silicon and are chosen to be adjacent to each other on the wafer. Since the same pressure is applied to the boss side of both sensors, and a second pressure is applied to the opposite side of the second or differential sensor, it is obvious that the deflection and thus the stress of the second sensor is determined by the pressure difference across the deflecting portion of the sensor. In sensors made in accordance with the teachings of Kulite U.S. Pat. No. 5,955,771 it is easier to have essentially equal thicknesses in the thinned-down regions (webs) of each sensor (the region between the boss and the non-active support rim of the sensor). Thus to obtain the same stresses in the thin sections of each in the sensor, the overall active area of each sensor must be different. For the same thickness web, if the absolute value of $(P_2-P_1)$ where $P_2$ is the pressure applied to the front side of the two sensors and $P_1$ is the pressure applied to the differential sensor through the metal tube, is less than $P_2$, to obtain the same stress in each sensor a greater active area in the differential sensor is required. Conversely, if the absolute value of $P_2-P_1$ is greater than $P_2$, than a smaller active area in the differential sensor is required.

By choosing adjacent sensors with the same web thicknesses but different active areas, there is another unanticipated advantage. Both the thermal zero shift and the thermal sensitivity shift are controlled by the impurity concentrations of the P+ regions and by how well they match each other. Thus, the thermal properties of the two individual sensors can be more closely controlled and matched to each other resulting in a better overall combined absolute-differential transducer.

The two sensors may be used in a single attached body and thus mounted in a single operation or they may be first cut apart and then mounted separately.

The two sensors are produced in accordance with the methods described in Kulite U.S. Pat. No. 5,955,771 starting with Line 26, Column 4 with detailed revisions to describe production of the composite absolute/differential transducer with the novel header assembly design for accurately measuring both pressures simultaneously.

DETAILED DESCRIPTION OF THE INVENTION

Figure 1A:
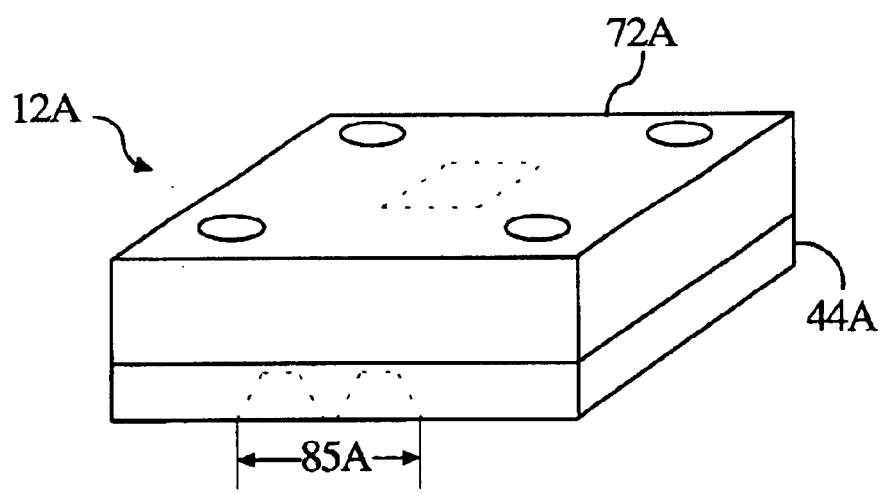
FIG. 1A is a perspective view of a hermetically sealed sensor chip which is employed in this invention as an absolute sensor and is a prior art device.
Figure 1B:
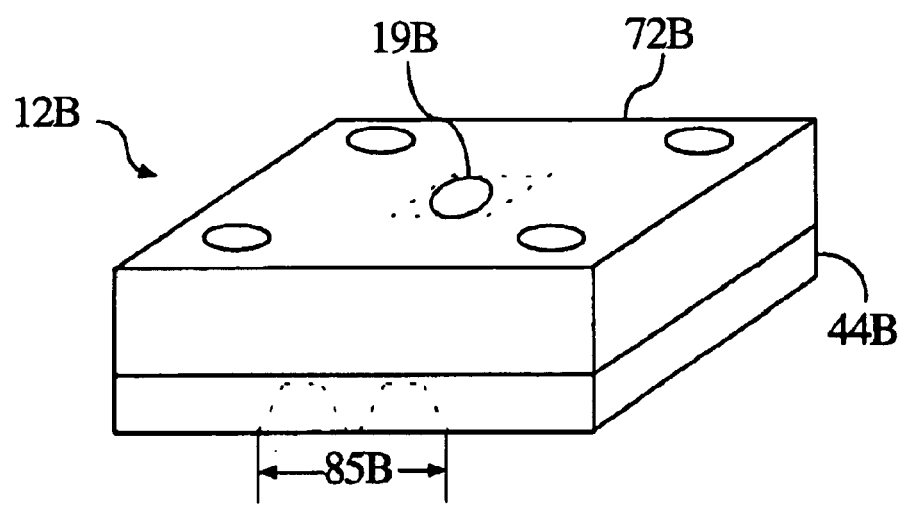
FIG. 1B is a perspective view of a hermetically sealed sensor chip employed in this invention to provide a differential sensor configuration.
Figure 1C:
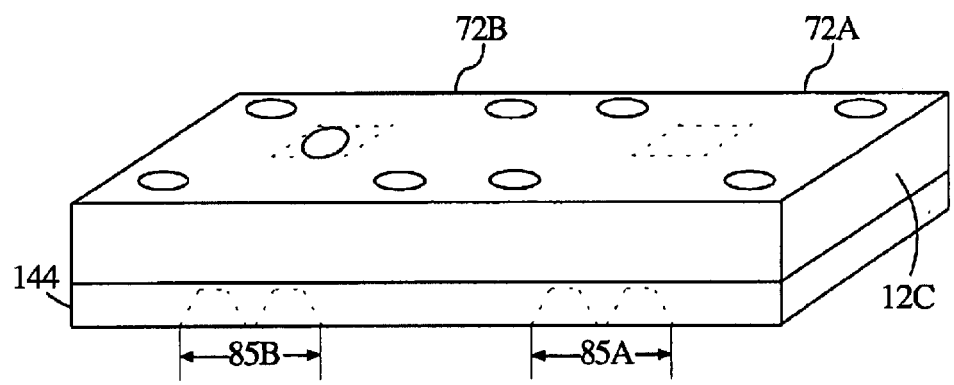
FIG. 1C is a perspective view of a sensor chip having an absolute and differential sensor located adjacent one another on a single wafer.

In FIG. 1A there is shown a perspective view of the sensor transducer chip 12A used in the present invention. The chip shown in FIG. 1A is that shown in FIG. 1 of the '771 patent. The chip comprises an individual semiconductor pressure sensor 44A, which is hermetically sealed by a cover 72A. In FIG. 1B there is shown a perspective view of another sensor transducer chip 12B also used in the present invention. The chip also comprises an individual semiconductor pressure sensor 44B, which is sealed by a cover 72B containing an additional through-hole 19B to be used for differential measurement. The numerals 85A and 85B refer to the active region of the respective chips or that region which defects upon an application of a force to the chip. FIG. 1C depicts a single chip or wafer 12C having located thereon on the sensor transducer chip of FIG. 1A adjacent the sensor transducer chip of FIG. 1B. These are provided on a common chip or wafer as shown in FIG. 1C. There is shown the chips associated with a pressure sensor module or wafer 144 having active region or area 85B for the left sensor and an active region 85A for the right sensor. The left sensor being the differential sensor and the right being the absolute sensor.

Figure 2:
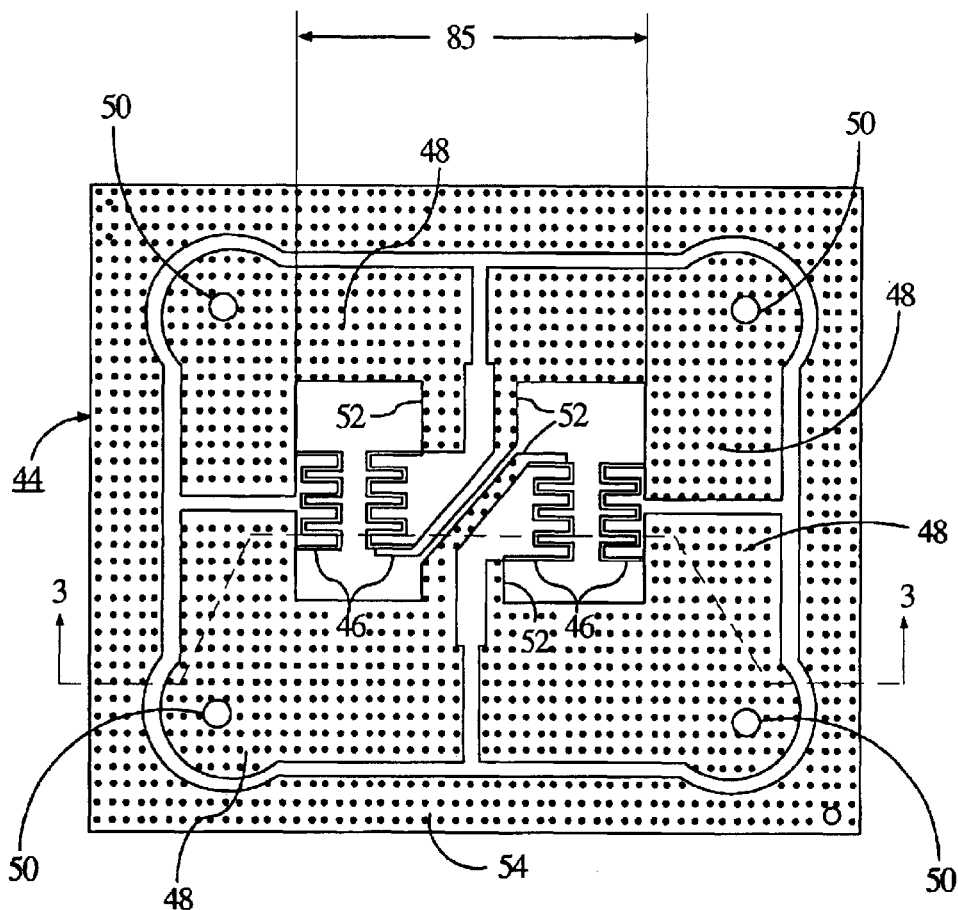
FIG. 2 is a top plan view of a semiconductor transducer employed in the sensor chips of FIGS. 1A, 1B and 1C.

A top plan view of the semiconductor sensor 44, used in fabricating both the absolute and differential sensor structures, of FIGS. 1A and 1B is depicted without the covers 72A or 72B in FIG. 2. The reference numeral 44 is employed as for sensor 44A and 44B of FIGS. 1A and 1B. The pressure sensor 44 is approximately 100 mils by 100 mils and is fabricated from two or more semiconductor wafers of silicon, or any other suitable semiconductor wafer material. The sensor or transducer 44 is fabricated using conventional wafer processing techniques which enable a number of dielectrically isolated piezoresistive sensor elements such as 46, composed of highly doped (P+) silicon to be formed on dielectric films of $SiO_2$ or the like. It is understood that a number of such sensors can be made at the same time on a large substrate (FIG. 1C). By fabricating both sensors at the same time on the same wafer and by choosing adjacent sensors with the same web thickness but different active areas, there is another unanticipated advantage. Both the thermal zero shift and the thermal sensitivity shift are controlled by the impurity concentrations of the P+ regions and by how well they match each other. Thus, the thermal properties of the two individual sensors can be more closely controlled and matched to each other incurring a better overall combined absolute-differential transducer.

The two sensors may be used in a single attached body and thus mounted in a single operation or they may be first cut apart and then mounted separately.

Each sensor element 46 is essentially a variable resistor in one of four legs of a Wheatstone bridge circuit with each of the respective resistances varying in proportion to an applied force or pressure to the transducer 44. Reference numeral 54 refers to a raised outer peripheral rim which will be used to electrostatically bond a glass cover member to the sensor. As can also be seen, there are interconnections 52 which are directed from the piezoresistors 46 to the contact areas or fingers 48. The active area 85 is shown and basically is the area that deflects upon application of force. The sensors 46 on the left and right of the center are separated by a thick central boss 66 (FIG. 3).

The circuit nodes of the Wheatstone bridge consist of four oversized P+ diffused silicon electrical contact areas or fingers 48, which are mainly located in non-active areas of the transducer 44. The term "finger" is used to indicate that the areas 48 project from the sensor 46 to the metal contacts 50. The metal contacts 50 within the contact area are circular in shape and are each approximately 10 mils in diameter. Each contact 48 includes a centrally located area of high temperature platinum-titanium metallization 50.

Figure 3:
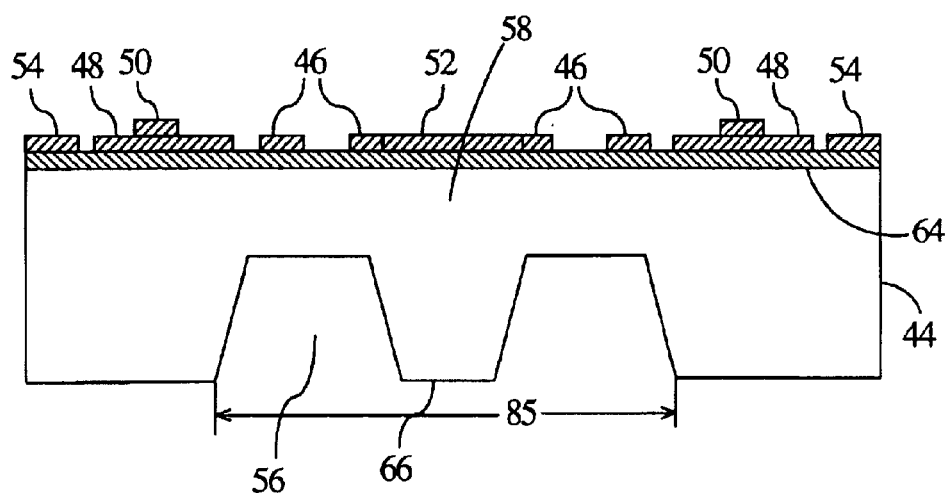
FIG. 3 is a cross sectional view taken through line 3—3 of FIG. 2 depicting a sensor arrangement.

Referring to FIG. 3, which shows a cross-sectional view through line 3—3 of FIG. 2, a closed-ended aperture 56 is formed in the bottom of the transducer 44. The area above the aperture is generally referred to as the "active area" 85 of the transducer 44, this area defining an N-type silicon diaphragm 58 to which the sensor elements 46 are attached and located. The "active area" deflects upon the application of a force thereto. The areas of the transducer 44 that are external to the active area are conventionally termed the "non-active" areas. The dielectrically isolated sensors elements 46, the electrical contacts 48, the interconnections 52, and the raised rim 54 are readily fabricated using processes described in the U.S. Pat. No. 5,286,671 to Kurtz et al., the disclosure of which is incorporated herein by reference. Located in the active area 85 is a boss 66 which separates the active area 85 into the first and second regions for sensors 46.

Figure 4A:
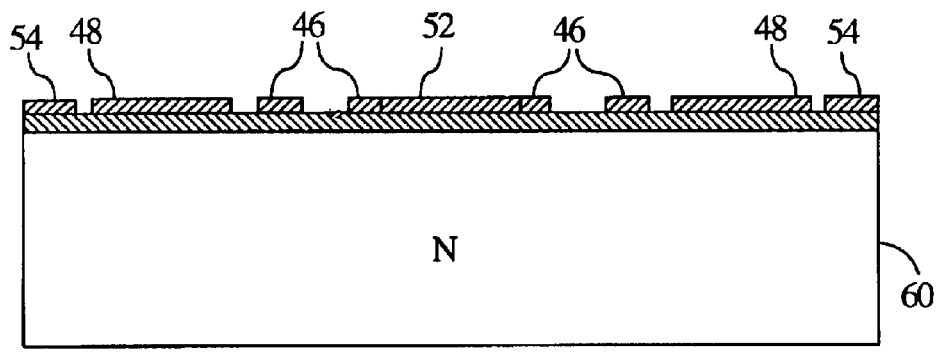
FIGS. 4A, 4B and 4C are cross sectional views useful in depicting fabrication of typical sensor devices according to this invention.

The process taught in U.S. Pat. No. 5,286,671 starts with an N-type sacrificial wafer 60 (FIG. 4A) into which the high conductivity P+ areas which form the sensor elements 46, the contacts 48, and the interconnections 52 are diffused using oxide and/or nitride masking and photolithography as shown. In the present invention, the P+ raised rim 54 is also fabricated along with the other P+ structures. There are also shown the metal contact areas 50 which are circular and which are deposited or formed on the contact finger 48.

Figure 4B:
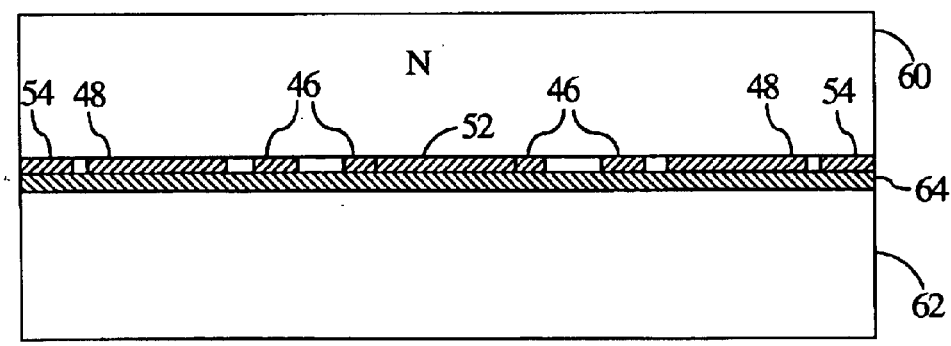

As is understood, subsequent to the diffusion, the surface of the sacrificial wafer 60 is treated with a conductivity-selective etch which does not attach the P+ areas 46, 48, 52, 54 leaving them raised from the surface. In FIG. 4B, the sacrificial wafer 60 is then fusion-bonded to an N-type "diaphragm" wafer 62 which has been previously treated to obtain a dielectric layer 64 of preferable 5000 to 15,000 Angstroms (Å) of silicon dioxide thereon. Although the dielectric layer 64 is preferably silicon dioxide, other dielectric layers can be used as well. The dielectric layer 64 operates to dielectrically "isolate" the sensor elements 46 from the diaphragm wafer 62. After fusion bonding, the N-type material of the sacrificial wafer 60 is removed using a conductivity-selective etch, leaving only the P+ sensors 46, the interconnections 52, the contact areas 48 and the raised rim 54 bonded to the diaphragm wafer 62 to produce the transducer 44 of FIG. 3. The entire surface containing the P+ elements, the sensor elements, the interconnections, the contact areas and the raised rim, is oxidized or otherwise coated with an oxide layer. The oxide is then removed from the center of the contact areas, which are to be metallized using conventional techniques. The oxide layer is then removed from the rim and the rest of the contact areas leaving a thin strip of oxide of about 0.001" to 0.002" along each edge of the rim and the contact areas. Thus, an oxide layer remains on the edge of the horizontal surface of the rim and the contact areas extending along each vertical surface to the underlying oxide layer to which each of the P+ regions are bonded. The P+ regions of the active portion of the sensor still have an oxide layer over their entire horizontal surfaces as well along their vertical surfaces again extended to the field oxide layer to which the sensor network is bonded.

Figure 4C:
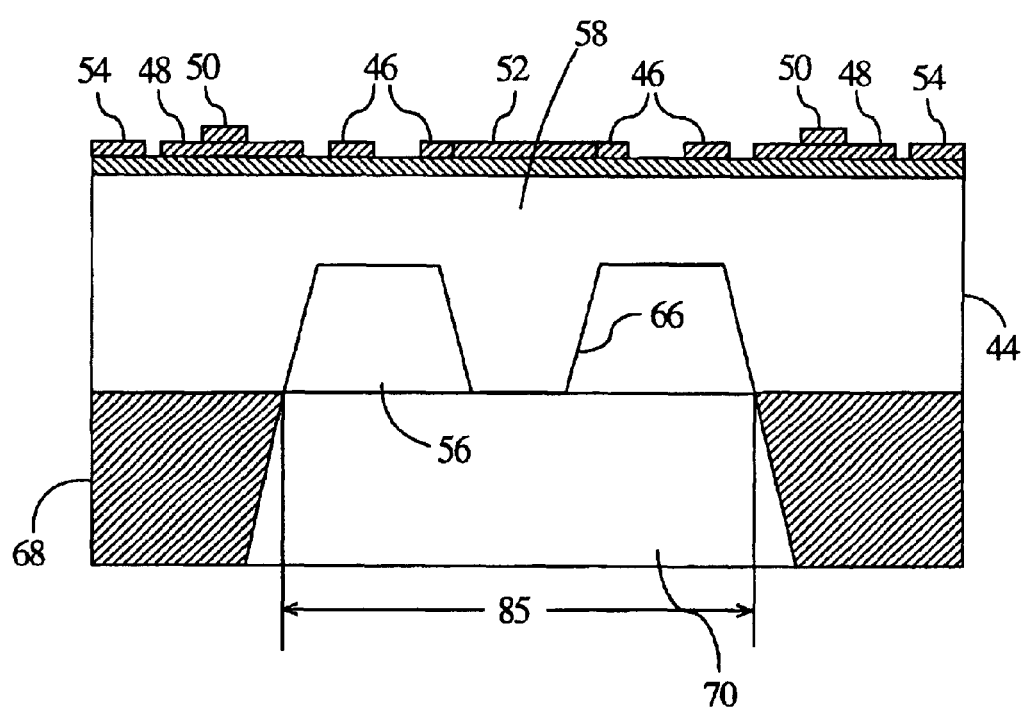

Referring to FIG. 4C, the aperture 56 is fabricated in the bottom of the diaphragm wafer 44 to form the diaphragm section 58 of the transducer 44. The thickness of the diaphragm determines its stiffness.

In the preferred embodiment, the two sensors are made from the same wafer of silicon and are chosen to be adjacent to each other on the wafer (FIG. 1C). Since the same pressure is applied to the boss 66 side of both sensors, and a second pressure is applied to the opposite side of the second or differential sensor, it is obvious that the deflection and thus the stress of the second sensor is determined by the pressure difference across the deflecting portion of the sensor. In sensors made in accordance with the teachings of Kulite U.S. Pat. No. 5,955,771 it is easier to have essentially equal thicknesses in the thinned-down regions (webs) of each sensor (the region between the boss and the non-active support rim of the sensor). Thus to obtain the same stresses in the thin sections of each in the sensor, the overall active area of each sensor must be different. For the same thickness web, if the absolute value of $(P_2-P_1)$ where $P_2$ is the pressure applied to the front side of the two sensors and $P_1$ is the pressure applied to the differential sensor through the metal tube, is less than $P_2$, to obtain the same stress in each sensor a greater active area in the differential sensor is required.

FIG. 1C shows a composite sensor chip suitable for such application with the differential sensor B having a larger active area than that of absolute Chip A. Conversely, if the absolute value of P2–P1 is greater than P2, than a smaller active area in the differential sensor is required. The position of the sensor elements 46 with respect to the diaphragm 58 is determined by the form factor of the diaphragm 58, i.e., flat plate or the shown-bossed structure identified by numeral 66. The diaphragm wafer 44 itself may be shaped using known etching techniques as is taught in U.S. Pat. No. 4,236,137 to Kurtz et al. entitled, "Semiconductor Transducers Employing Flexure Frames" which issued on Nov. 25, 1980 and is assigned to Kulite Semiconductor Products, Inc., the assignee herein, which is incorporated herein by reference.

At this point, a glass substrate 68 can be optionally provided if desired by electrostatically bonding it to the non-sensing side of the transducer 44 for additional clamping, as is shown in FIG. 4C. The glass substrate 68 may be made of a PYREX layer. The glass substrate 68 or silicon substrate includes an aperture 70 that extends therethrough. The aperture 70 allows a force or pressure to be applied to the underside of the diaphragm 58 to deflect and induce a stress, which causes the resistances of the piezoresistive sensor elements 46, to change.

Figure 5A:
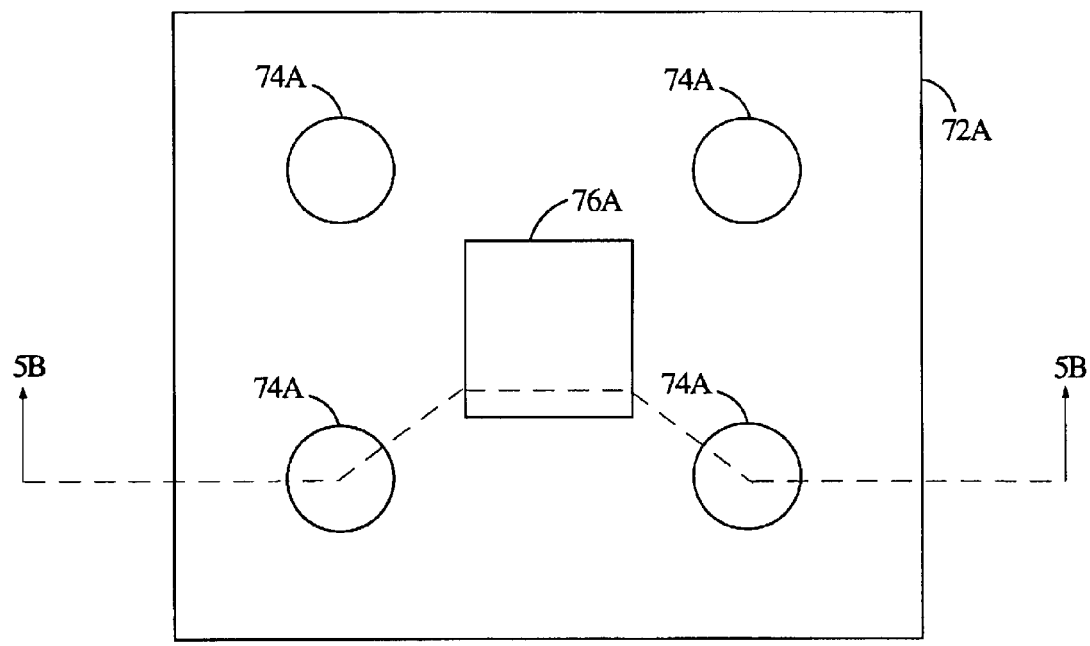
FIGS. 5A, 5B, 5C, 5D, 5E and 5F depict top plan views and cross sectional views of cover members for sensor devices according to this invention.
Figure 5B:
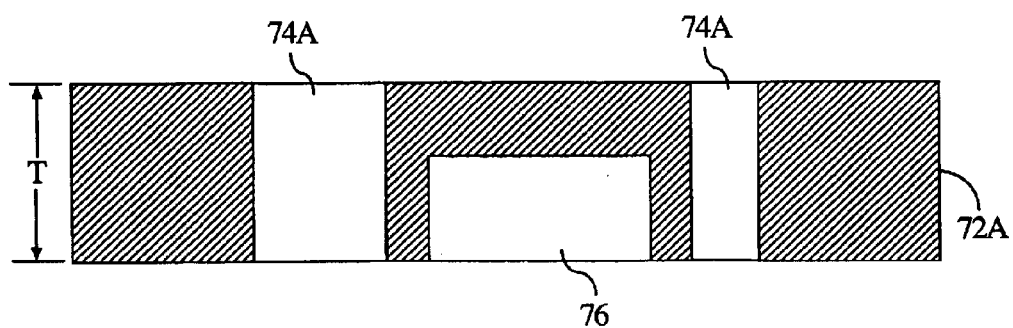

For the absolute pressure sensor, referring now to FIG. 5A, there is shown a bottom view of the cover 72A which is to be bonded to the transducer 44 of either FIGS. 3 or 4C. FIG. 5B is a cross sectional view taken through line 5B—5B of FIG. 5A. The cover 72A is fabricated from a glass such as PYREX. It is understood that geometries other than square may be utilized for the cover 72A with the geometry used being generally congruent to that of the transducer 44. In any case, the cover 72A has four apertures 74A disposed in areas of the cover 72A which will overlie the metallized portions 50 (FIG. 2) of the contacts 48 of the transducer 44. Each aperture 74A is fabricated to be approximately 10 mils in diameter so that a corresponding header pin 36 (FIG. 8C) can be received therein as will be explained. The cover 72A also has a centrally located cavity 76A which will overlie the active area of the transducer 44A and enable the diaphragm 58A to flex when a force or pressure is applied thereto. As shown in FIG. 5B, the cover 72A has a thickness T which is on the order of approximately 5 mils thick.

Figure 5C:
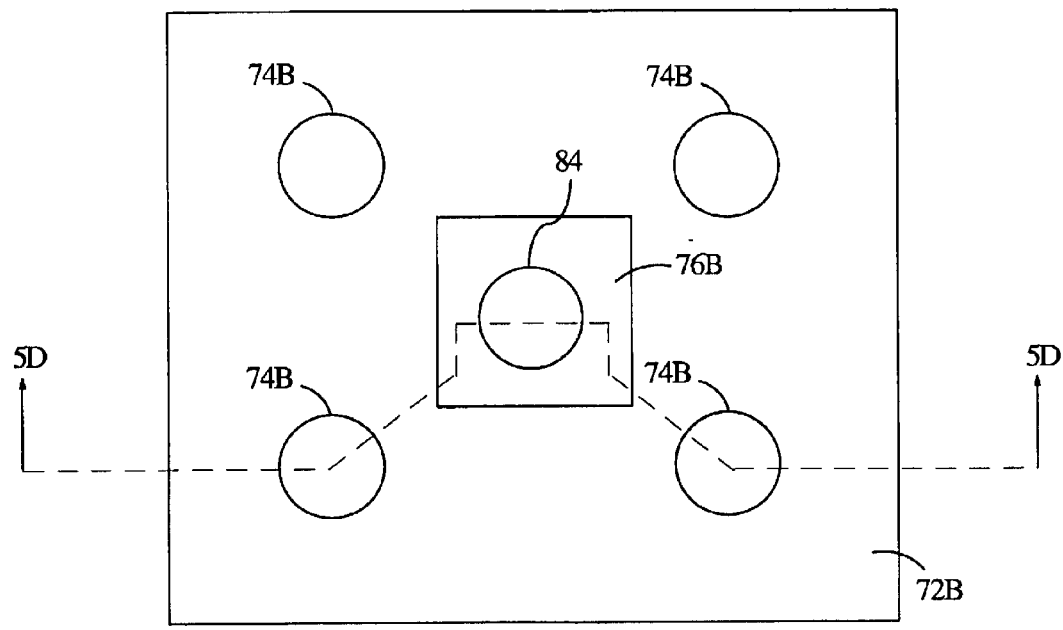
Figure 5D:
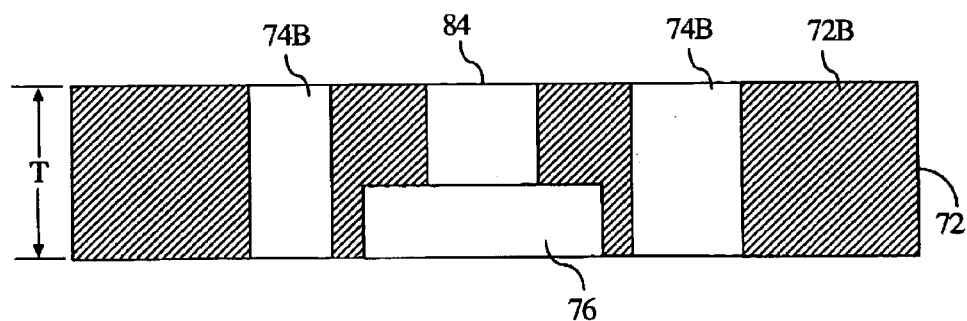

For the differential pressure sensor, referring now to FIGS. 5C and 5D, the cover 72B will be made in the exact same manner as the cover 72A, used for absolute pressure sensor, except that the cover 72B will contain an additional aperture 84 to enable the diaphragm to receive the pressure signal when it is applied from that side. FIG. 5D is a cross sectional view taken through line 50—50 of FIG. 5C.

Figure 5E:
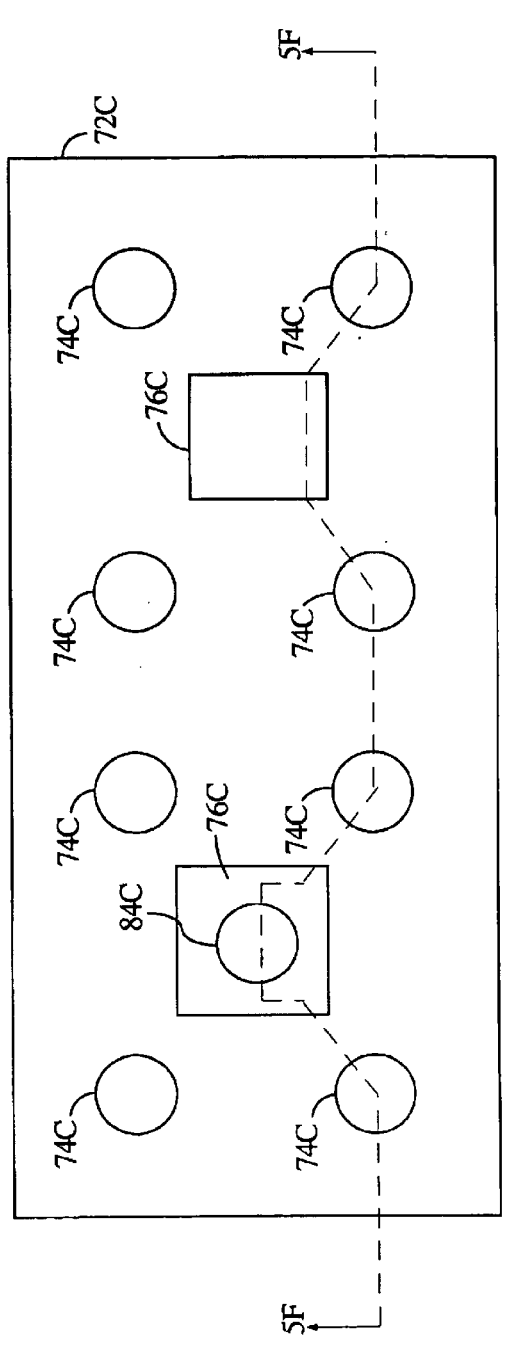
Figure 5F:
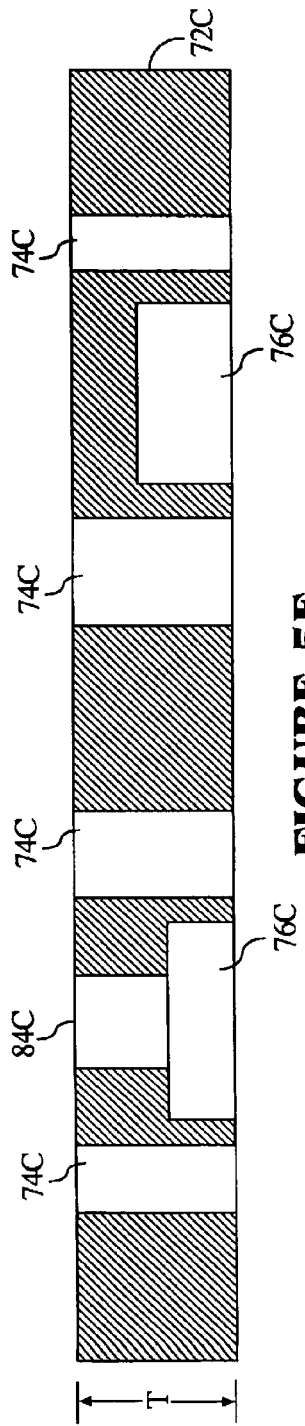

For the combined absolute/differential single chip approach where both the absolute and the differential sensors are built into one chip, referring now to FIGS. 5E, and 5F, the cover 72C will be made in the exact same manner as both covers 72A and 72B. The only difference is that pressure of the aperture 84C will take place on every other device pattern on the wafer level. That is that every absolute 72A pattern will be followed by a 72B pattern across the entire wafer. Thereby an absolute sensor will always be followed by a differential sensor. Note, the cavity on the side of cover 72C used for the differential sensor is shown to be larger than for the absolute sensor. This is done because we assume that the differential pressure to be measured will be smaller than the absolute one. The absolute value of $(P_2-P_1)$ is smaller than $P_2$.

Once fabricated, the cover 72A or 72B or 72C is ready to be electrostatically bonded without sealing glasses and the like to the transducer 44 of FIGS. 3 or 4C. The cover is applied directly to transducer 44 so that the bottom surface of the cover directly engages the P+ diffused raised rim 54 and enlarged contacts 48 in the non-active area of the transducer 44. No sealants of any type are needed between the cover and the transducer 44 because the oversized contacts 48 and the raised rim 54 are provided on the transducer 44. The cover is then electrostatically bonded to the transducer by placing the two wafers in a heated vacuum chamber (not shown) and heating them under a vacuum for about 45 minutes at approximately 400° C. At the same time, a high voltage on the order of 400 to 1500 volts D.C. is applied between the cover and the transducer 44. This process causes the bottom surface of the cover to become slightly conductive such that an intimate bond between the cover and the P+ diffused raised rim 54 and fingers 48 of the transducer 44. The seal to the rim and the fingers provide the hermetic seal for the sensor.

Upon completion of the electrostatic bonding operation the transducer 44 is now hermetically sealed and the resulting wafer of which an individual sensor is shown as either chip 12A, 12B or 12C; FIGS. 1A, 1B or 1C is removed from the vacuum chamber. Note, the active area of the differential sensor is shown to be larger than the active area of the absolute sensor. This is because we assume that the differential pressure to be measured will be smaller than the absolute one. Absolute value of $(P_2-P_1)$ is smaller than $P_2$. For the case of absolute value $(P_2-P_1)$ being greater than $P_2$, the absolute chips active will be made bigger than that of the differential. The wafer is now cut into individual dice the structure of which is shown in as 12A, 12B or 12C leaving the rim portion on the outside of the chip. For the composite 12C sensor two consecutive sensors are cut as one die. The seal to the rim insures that there is no passage of gas or any fluid from the outside of the chip into the active area. In addition, the seal to the fingers also insures that there is no passage of gas or other fluids from the contact area into any internal portion of the sensor.

Figure 6A:
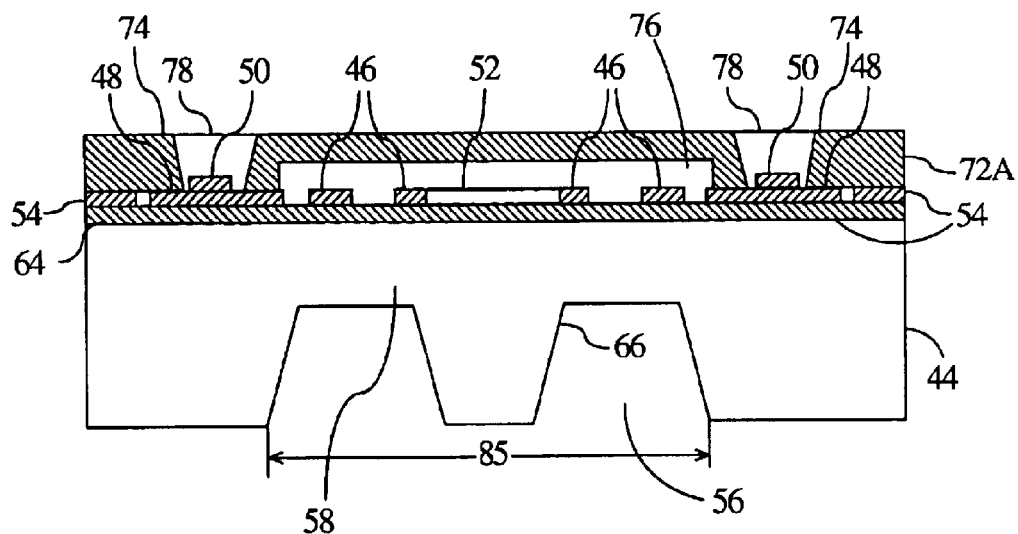
FIGS. 6A, 6B, and 6C are cross sectional views of the semiconductor sensor according to this invention after a glass covered member has been bonded to the sensor to produce a hermetically sealed sensor as shown in FIGS. 1A, 1B and 1C.
Figure 6B:
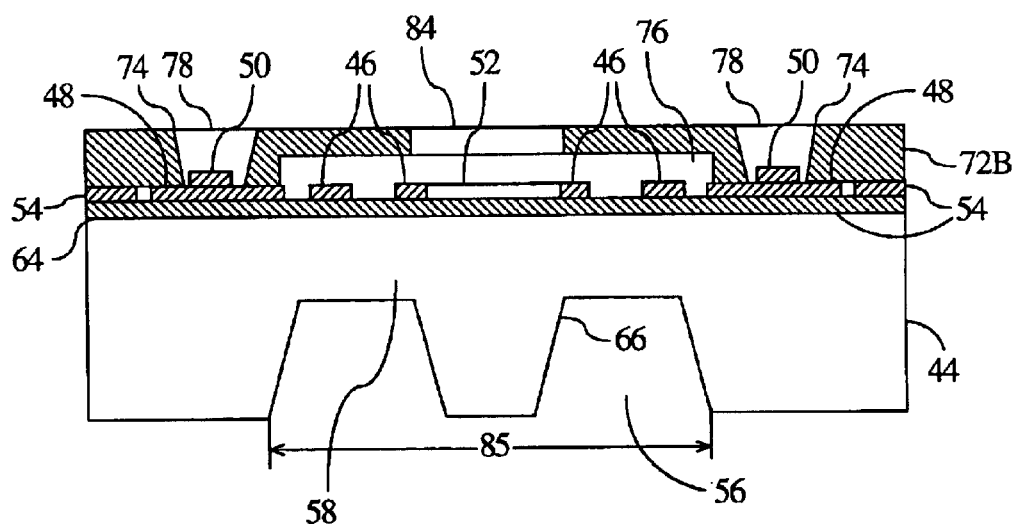
Figure 6C:
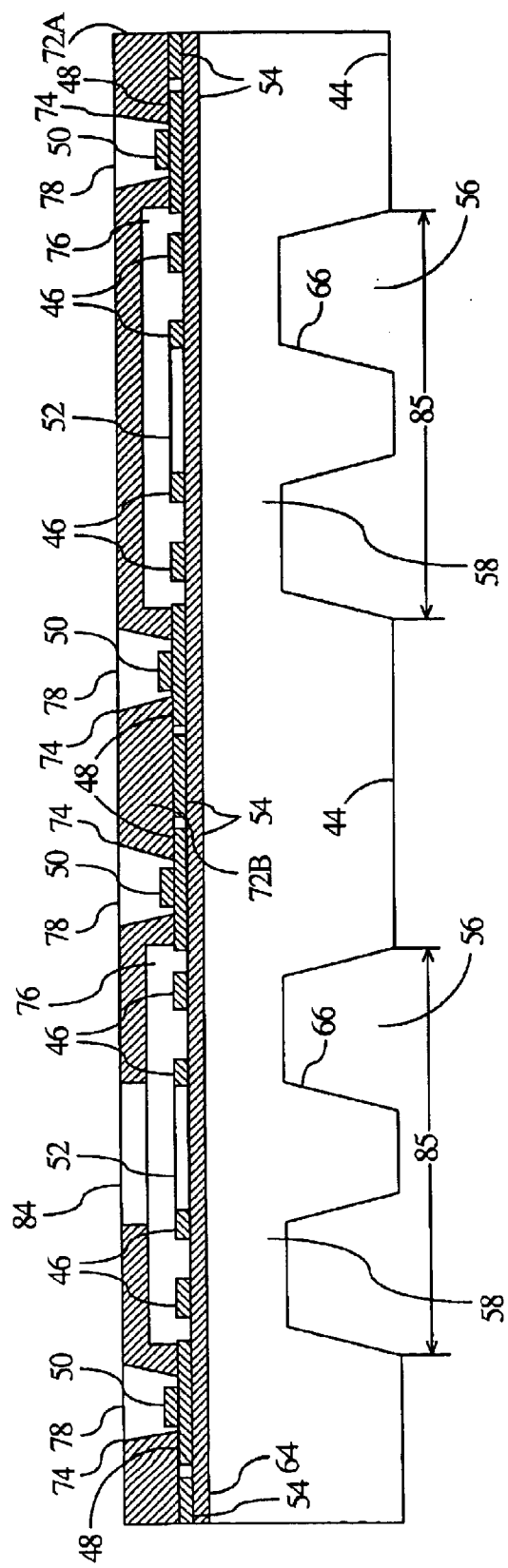

Referring now to FIGS. 6A, 6B or 6C, sensor chips are prepared for header mounting by filling the apertures 74 in the cover with a conductive glass frit 78, preferably a mixture of gold and glass frit. The same reference numerals are shown to enable one to determine similar functioning parts, as for example, 48 for the contact areas, 46 for the sensors and so on. It is preferred that the glass frit is made with PYROCERAM, a glass material manufactured by Corning Glass Co. These glasses are thermosetting and devitrify at temperatures on the order of 450 degrees C. Upon deverification, the glass develops a crystalline structure, which results in a strong seal as the crystallized material's softening point is higher than conventional glass. PYROCERAM also exhibits excellent mechanical properties at temperatures well in excess of 400 degrees C.

The PYROCERAM glass frit is prepared by mixing the finely powdered PYROCERAM glass and gold with a suitable suspension vehicle, such as a mixture of nitrocellane in anylacerate, to a desired consistency to form a paste-like mixture of gold-glass frit. The paste-like mixture of gold-glass frit 78 is then injected using any suitable method into each aperture 74 of the cover 72A, 72B or the cover 72C.

The header 14 (FIG. 8A) described earlier is prepared by depositing a layer of PYROCERAM glass frit 80 prepared without the gold powder, onto the mounting surface 30 (FIG. 8C) of the header glass 20 either manually or automatically using suitable tooling. The layer of glass frit 80 (FIG. 7C) is deposited to a thickness of approximately 0.1 to 0.5 mils.

The composite absolute/differential sensor chip is then lowered onto the mounting surface 30 of the glass header 20 (FIG. 8A) with the cover 72C of the chip 12C facing the mounting surface 30 (FIG. 8C) such that the header portions 40 of the header pins 36 enter the conductive-glass-frit 78 filled apertures 74C in the cover. Aperture 84 of the differential sensor must be aligned to the tube 82 (FIG. 7C) in the header. The tube 82 communicates with the cavity 76 defined between the cover 72 and the transducer 44 via an aperture 84. The structure is then placed into a heated chamber (not shown) and a uniform, moderate pressure is applied to the chip 12C (FIG. 1C) using a clamping fixture or the like to ensure that the glass non-conductive frit 80 located between the mounting surface of the glass header 20 the outer surface of the cover 72C is evenly distributed therebetween. The structure is then fired or heated for about 45 minutes at approximately 500 degrees C. to simultaneously both cure the glass frit 80 and conductive-glass-metal-frit 78, thereby achieving a hermetic mounting of the chip 12C on the glass header 20 as shown in FIG. 7C. Note that the head portions 40 of the header pins 36 are spaced from the metallization areas 50 of the contacts 48 as shown in FIG. 7C. It should be understood, however, that due to manufacturing tolerances and the like, that the head portions 40 of the header pins 36 can also directly contact the metallized portions 50 of the contacts 48 without any harmful effects.

Figure 7A:
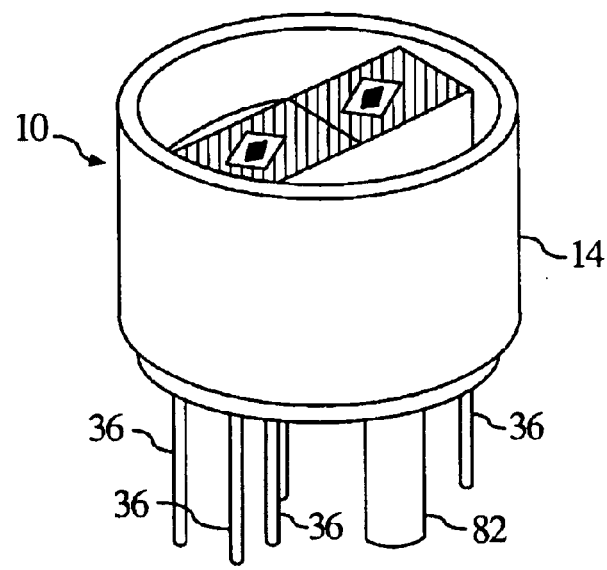
FIG. 7A is a perspective view of a hermetically sealed sensor made in accordance with the present invention.
Figure 7B:
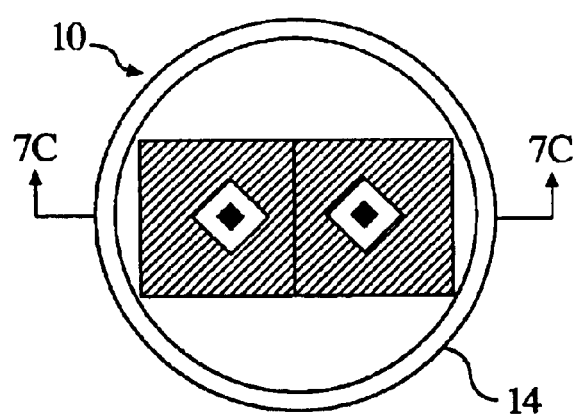
FIG. 7B is a top plan view of the center of FIG. 7A.
Figure 7C:
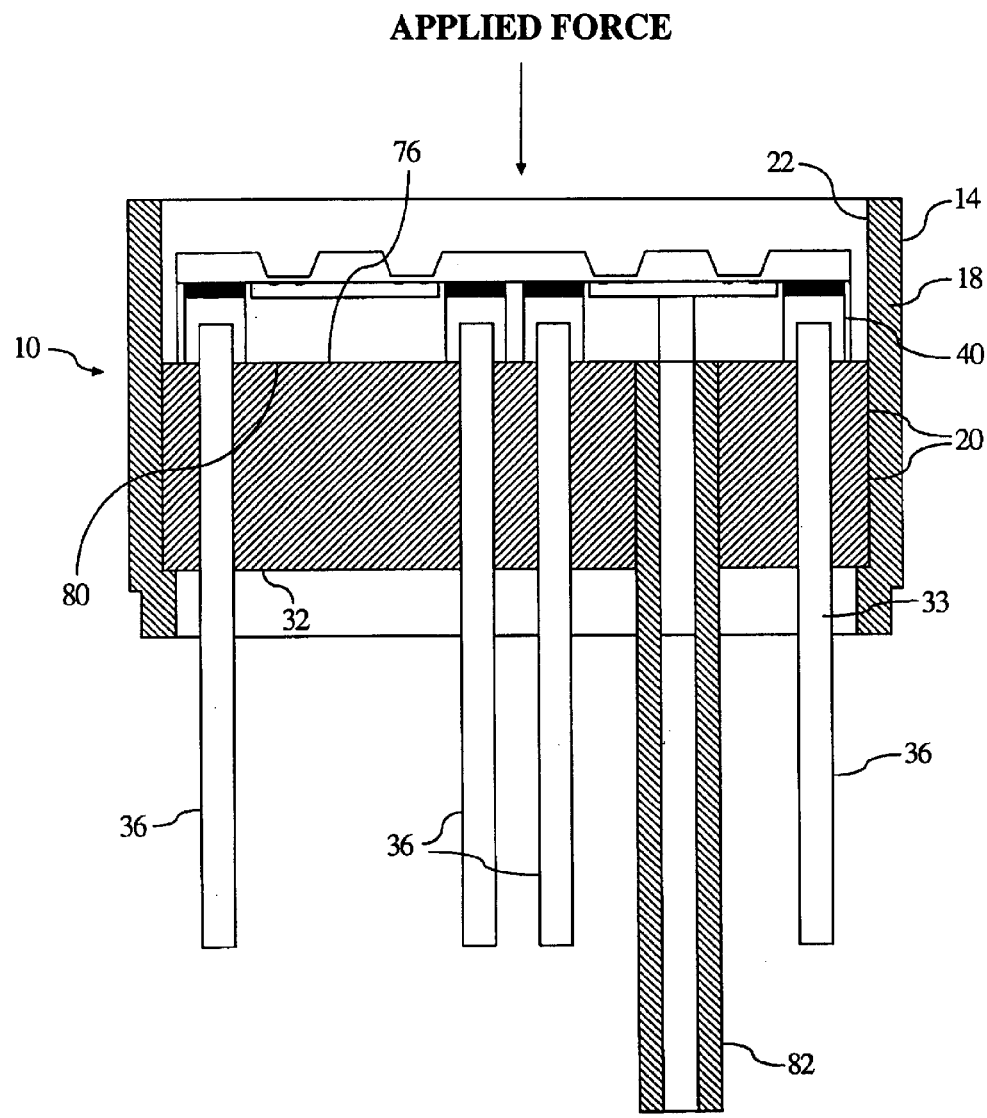
FIG. 7C is a cross sectional view through line 7C, 7C of FIG. 7B.

Referring to the perspective and top plan view of FIGS. 7A and 7B a sensor 10 made in accordance with the present invention is shown. The sensor 10 is preferably a pressure transducer comprised of a composite absolute/differential semiconductor transducer chip 12C packaged within a specially configured header 14 using a "lead-less" packaging technique as will be explained further on. Eight header pins 36 extend out from the base of the header 14 to allow the sensor 10 to be electrically connected to external wires.

Figure 8A:
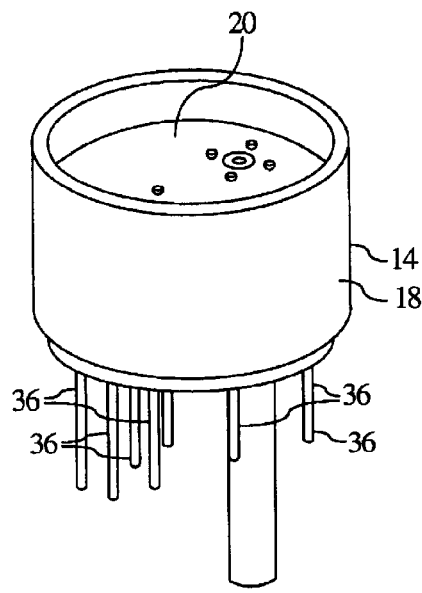
FIG. 8A is a perspective view of the sensor used in FIG. 7A.
Figure 8B:
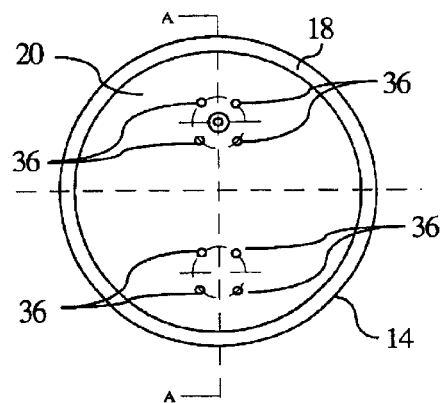
FIG. 8B is a top plan view of the header shown in FIG. 8A.

Referring now to FIGS. 8A and 8B, the header 14 comprises a generally tubular-shaped sleeve or header shell 18 fabricated from a typical metallic material and a cylindrical-shaped glass header 20. In a preferred embodiment, the header shell 18 is fabricated from a metal or alloy material such as an iron-nickel-cobalt alloy sold under the trademark, KOVAR. This material may be nickel or chrome plated to prevent rusting. The header shell 18 has a cylindrical inner surface 22 of a diameter sufficient to accommodate the glass header 20 (FIG. 7).

Figure 8C:
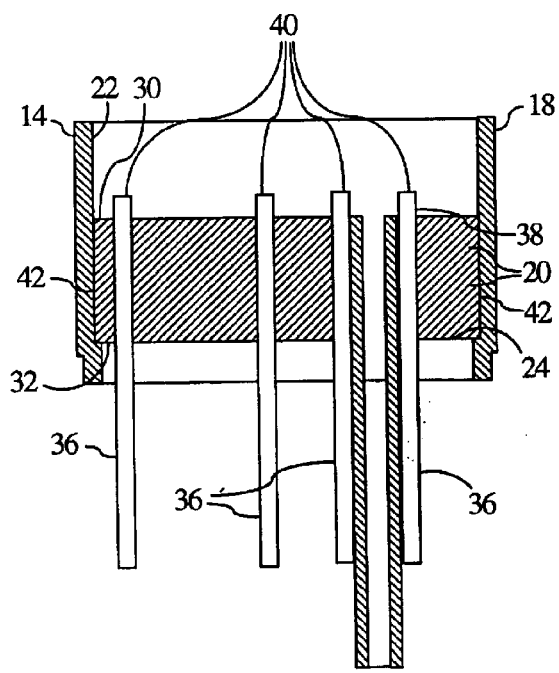
FIG. 8C is a cross sectional view taken through line 8C—8C of FIG. 8B.

As shown in FIG. 8C, which is a cross-sectional side view through line 8C—8C of FIG. 8B, the inner surface 22 of the header shell 18 includes a circular-shaped flange 24 at a marginal end thereof. The glass header 20 seats against the flange 24 and is hermetically bonded and sealed to the inner surface 22 of the header shell 18 (including the flange 24) preferably by any suitable glass-to-metal seal.

Figure 8D:
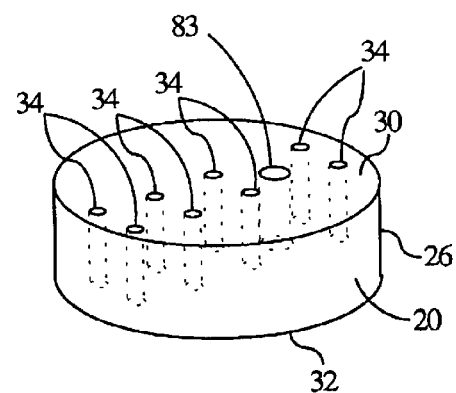
FIG. 8D is a perspective view of a glass header portion of FIGS. 8A, 8B and 8C.

Referring to FIG. 8D, the glass header 20 (FIG. 8B) consists of a cylindrical glass members 26, each of which is fabricated from a borosilicate glass such as is sold by Corning Glass under the trademark, PYREX. The glass member is selected to match the thermal expansion coefficient of silicon. In any case, eight apertures 34 extend coaxially through the glass header 20 and are spaced concentrically apart. An additional aperture (83) through which a tube 82 extends through the glass header 20 is located on the side above the differential side of the composite chip 12C will be mounted (FIG. 7A).

Referring again to FIG. 8C, a metallic header pin 36 is inserted into each of the eight apertures 34 (FIG. 8D). Each header pin 36 comprises a shaft member 38 and a head member 40 which extends past the end of the glass. The header pins 36 may be fabricated from KOVAR and gold plated. When installed in the apertures 34 of the glass header 20, the head members 40 of the header pins 36 engage the mounting surface 30 of the glass header 20 and protrude 2–5 mils therefrom. The shaft members 38 of the header pins 36 extend all the way through the aperture 34 and away from the base surface 32 of the glass header 20, the header pins 36 are hermetically bonded and sealed within the apertures 34 preferably by any suitable glass-to-metal seal 42. The pins are spaced such that their spacing corresponds to the spacings of the apertures in the chip. At the same time the tube 82 is hermetically bonded and sealed within an aperture (83) specifically designed for the tube.

The lead-less packaging method of the present invention provides excellent electrical continuity between the chip's contacts and the header pins. A transducer device made in accordance with the present invention exhibits all the advantages associated with dielectrically isolated sensing elements and is substantially protected from the operating environment.

While the sensor as indicated above can be made from the same wafer or substrate, it is understood that they can also be made from different wafers using the same or similar semiconductor processing techniques to assure thermal and circuit matching and therefore compatibility of the sensors.

Moreover, although the hermetic bonding process of the present invention has been described in conjunction with a "dielectrically isolated" type of transducer, it should be understood that "non-isolated" types of transducer structures and the like, can likewise be packaged according to the methods and techniques of the present invention.

What is claimed is:

1. A combined absolute and differential pressure transducer, comprising:

first and second sensors each having a piezoresistive structure thereon and responsive to an applied force to produce an output according to the magnitude of said applied force, each of said sensors fabricated from a common wafer process to enable said sensors to be matched in regard to thermal properties, said first sensor having a cover member and operative to receive a first force to provide an absolute pressure output, said second sensor having a cover member having a port aperture therein to enable said second sensor to receive said first force as applied to said first sensor and a second force applied via said aperture to provide a differential output pressure, said first and second sensors having substantially equal diaphragm thicknesses and having substantially different active areas, so as to accurately measure both absolute and differential pressures simultaneously.

2. The combined absolute differential pressure transducer according to claim 1 wherein, said first and second sensors are included on separate substrates obtained from a common wafer with said common wafer process.

3. The combined absolute differential pressure transducer according to claim 1 wherein said first and second sensors are located on the same substrate having a common cover member.

4. The combined absolute differential pressure transducer according to claim 1 wherein the active area of said differential sensor is larger than the active area of said absolute sensor.

5. The combined absolute differential pressure transducer according to claim 1 wherein the active area of said absolute sensor is larger than the active area of said differential sensor.

6. The combined absolute differential pressure transducer according to claim 1 wherein said first and second sensors include:
a semiconductor diaphragm member having a top surface coated with an oxide layer,
P+ sensors fusion bonded to said oxide layer at a relatively central area of said diaphragm,
P+ finger elements fusion bonded to said oxide layer extending from said sensors to an outer contact location of said diaphragm member for each finger,
an external rim of P+ material fusion bonded and surrounding said sensors and fingers,
a glass cover member electrostatically bonded to said fingers and rim to hermetically seal said sensors and fingers of said diaphragm member, said glass cover having a cavity above said sensors and having a plurality of apertures, each aperture associated with a separate finger at said contact location wherein each contact location can be accessed via said associated aperture in said glass cover.

7. The combined absolute and differential pressure transducer according to claim 6 including a conductive glass fit mixture having gold particles located in said apertures in contact with said contact locations.

8. The combined absolute and differential pressure transducer according to claim 6 wherein each of said sensors is approximately 100×100 mils with circular contact apertures each approximately 10 mils in diameter.

9. The combined absolute and differential pressure transducer according to claim 6 wherein each of said contact locations includes a centrally located area of platinum-titanium metalization.

10. The combined absolute and differential pressure transducer according to claim 1 wherein said first and second sensors are housed in a common header.

11. The combined absolute and differential pressure transducer according to claim 1 wherein at least one of said cover members is fabricated from PYREX.

12. The combined absolute and differential pressure transducer according to claim 1 wherein each of said sensors has a similar shape.

13. The combined absolute and differential pressure transducer according to claim 12 wherein each of said sensors is square.

14. The combined absolute and differential pressure transducer according to claim 1 wherein said first and second sensors are fabricated on a single chip having located thereon an absolute sensor pattern followed by a differential sensor pattern.

15. The combined absolute and differential pressure transducer according to claim 1 further comprising a header, wherein said header is fabricated from an iron-nickel-cobalt alloy.

16. The combined absolute and differential pressure transducer according to claim 1 wherein said first and second sensors are fabricated from silicon and said cover members are fabricated from glass.

17. The combined absolute and differential pressure transducer according to claim 1 wherein said piezoresistive structures are dielectrically isolated piezoresistive elements forming a Wheatstone bride array.

18. The combined absolute and differential pressure transducer according to claim 17 wherein said piezoresistive elements are P+ silicon elements.

19. The combined absolute and differential pressure transducer according to claim 18 wherein said dielectric isolation is achieved with silicon dioxide.

* * * * *